(12) United States Patent
Ahn

(10) Patent No.: US 6,671,339 B1
(45) Date of Patent: Dec. 30, 2003

(54) LOCK DETECTING APPARATUS AND METHOD FOR MULTIMEDIA DIGITAL BROADCASTING RECEIVER

(75) Inventor: Keun Hee Ahn, Inchon-Kwangyokshi (KR)

(73) Assignee: LG Electronics Inc., Seoul (KR)

(*) Notice: Subject to any disclaimer, the term of this patent is extended or adjusted under 35 U.S.C. 154(b) by 697 days.

(21) Appl. No.: 09/615,716

(22) Filed: Jul. 13, 2000

(30) Foreign Application Priority Data

Jul. 13, 1999 (KR) ............................................ 99-28279

(51) Int. Cl.[7] .......................... H03K 5/01; H04L 27/14
(52) U.S. Cl. ........................................ 375/346; 375/326
(58) Field of Search ................................. 375/346, 341, 375/316, 320, 268, 229, 339, 326

(56) References Cited

U.S. PATENT DOCUMENTS

5,363,408 A * 11/1994 Paik et al. .................. 375/261
5,471,508 A * 11/1995 Koslov ........................ 375/344

* cited by examiner

Primary Examiner—Khai Tran
(74) Attorney, Agent, or Firm—Birch, Stewart, Kolasch & Birch, LLP

(57) ABSTRACT

A lock detecting apparatus for a multimedia digital broadcasting receiver is disclosed. The present invention is a general purpose lock detecting apparatus applicable to a channel equalizer as well as a carrier recovery unit. Also, the present lock detecting apparatus uses two lock threshold values throughout a pull-in and lock-in, to improve the reliability of the lock detector for a false lock.

20 Claims, 8 Drawing Sheets

LOCK DETECTING APPARATUS AND METHOD FOR MULTIMEDIA DIGITAL BROADCASTING RECEIVER

BACKGROUND OF THE INVENTION

1. Field of the Invention

The present invention relates to a multimedia digital broadcasting receiver and, more particularly, to a lock detecting apparatus and method for a multimedia digital broadcasting receiver.

2. Description of the Related Art

A quadrature amplitude modulation (QAM) receiver is designated as the standard transmission system for cable channels in a digital television. Generally, the QAM receiver has a carrier recovery unit and a channel equalizer which primarily are used to remove noises such as frequency offset, phase offset, and ghost to minimize a mean-squared error (MSE). Accordingly, a criterion for determining whether the carrier recovery unit and the channel equalizer have removed such errors is required. Namely, a lock detector is required.

To enhance a bit error rate (BER) of the system after a pull-in of a corresponding noise, the carrier recovery unit uses gear shifting. The gear shifting method shifts a phase error detection algorithm from a blind mode to a decision-directed mode, thereby gradually decreasing the noise bandwidth of a loop filter. Such mode conversion method may be divided into a manual and automatic methods.

Compared to the automatic mode conversion method, the manual method is not as effective in coping with the randomness of a channel environment and system. Thus, the manual mode conversion method is usually inapplicable in communication modulation such as VSB, QAM, and QPSK. For this reason, most systems implement the automatic mode conversion method, which is realized by a lock detector.

FIG. 1 is a diagram of the lock detector of a multimedia digital broadcasting receiver in the related art comprising an analog/digital (A/D) converter 1, a first mixer 2, a first filter 3, a second mixer 4, a second filter 5, a channel equalizer 6, a first lock detecting unit 7, a phase/frequency error detecting unit 8, a decision device 9, a second lock detecting unit 10, a loop filter 11, and a numerical control oscillator 12. FIG. 2 is a diagram of the second lock detector unit 10 shown in FIG. 1, comprising first to third comparators 10a~10c, fourth to sixth comparators 10d~10f, first to fourth arithmetic units 10g~10i, a logic operator 10k, and a reliability counter 101. FIG. 3 is a diagram of a situation when constellations are rotating with a frequency offset of 256QAM.

The operation of the lock detector of a multimedia digital broadcasting receiver in the related art will next be explained with reference to FIGS. 1~3.

First, the A/D converter 1 converts receives and converts a QAM signal to a corresponding digital signal. The first mixer 2 mixes an intermediate frequency (IF) QAM signal converted by the A/D converter 1 with COS($\phi$) and outputs a first mixed signal. The first filter 3 removes noises from the first mixed signals output by the first mixer 2 and band filters the noise-removed first mixed signals to output a first filtered signal. The second mixer 4 mixes the IF QAM signal from the A/D converter 1 with SIN($\phi$) and outputs a second mixed signal. The second filter 5 removes noise from the second mixed signal and band filters the noise-removed second mixed signals to output a second filtered signal. Here, the first and second filters 3 and 5 are square root RC filters.

Thereafter, the channel equalizer 6 changes from a blind mode to a decision-direct mode and converts the filter structure in order to enhance the BER performance of the system after removing noises, i.e. ghost, included in the signals filtered by the first and second filters 3 and 5. To automatically control the conversion from the blind mode to the decision-direct mode, the first lock detecting unit 7 detects the signal from the channel equalizer 6.

The phase/frequency error detector 8 detects phase/frequency errors from the signal output by the channel equalizer 6 to generate a demodulated signal constellation. The decision device 9 detects and outputs a decision constellation based on the demodulated signal constellation from the phase/frequency error detector 8. Finally, the second lock detecting unit 10 detects variations in the demodulated signal constellation from the phase/frequency error detector 8 and in the decision constellation from the decision device 9.

Particularly, as shown in FIG. 2, the first to third comparators 10a~10c in the second lock detecting unit 10 compare the position of the rotating demodulated constellation signal (I_Constellation) output by the phase/frequency error detector 8 with a positive axis of the in-phase axis, 0 and a negative axis corresponding to the positive axis. The fourth to sixth comparators 10d~10f compare the position of the rotating demodulated constellation signal (Q_Constellation) output by the phase/frequency error detector 8 with a positive axis of the quadrature-phase axis, 0 and a negative axis. The orbit of an energy band of the rotating constellation will be detected according to Equation 1 below.

$$E = \sqrt{(I\_\text{constellation}^2 + Q\_\text{constellation}^2)} \qquad \text{[Equation 1]}$$

Thereafter, the first arithmetic unit 10g performs an operation on signals output by the first and fifth comparators 10a and 10e. Namely, the first arithmetic unit 10g uses a multiplier to multiply the output signal of the first comparator 10a by the output signal of the fifth comparator 10e, and generates a resulting signal Window_1. Similarly, the second arithmetic unit 10h uses a multiplier to multiply the output signal of the second comparator 10b by the output signal of the fourth comparator 10d, and generates a resulting signal Window_2. The third arithmetic unit 10i uses a multiplier to multiply the output signal of the third comparator 10c by the output signal of the fifth comparator 10e, and generates the resulting signal Window_3. The fourth arithmetic unit 10j uses a multiplier to multiply the output signal of the second comparator 10b by the output signal of the sixth comparator 10f, and generates the resulting signal Window_4.

Also, the first to sixth comparators 10a~10f and the first to fourth arithmetic units 10g~10j are configured to program a quantitative value of a window size to be within 4QAM and 256QAM.

The logic operator 10k performs a logic operation to the signals output by the first to fourth arithmetic units 10g~10j. Namely, the logic operator 10k is an OR gate that performs an OR operation on signals Window_1 to Window_4 output by the first to fourth arithmetic units 10g~10j to generate, for any one window, a "logical 1" upon receiving a rotating demodulated constellation signal or a "logical 0" upon failure of receiving a constellation signal.

The reliability counter 101 counts the signals output by the logic operator 10k based on a symbol clock for a predetermined period of time. Particularly, the reliability counter 101 enables a lock detection when a "logical 0" occurs for the predetermined time while counting the signals from the logic operator 10k based on the symbol clock. The reliability counter 101 disables a lock detection when a "logical 1" occurs for the predetermined time while counting the signals from the logic operator 10k based on the symbol clock.

Generation of the "logical 1" from the reliability counter 101 implies that the noises are still in a pull-in state in the carrier recovery block and that it is not time for switching the pull-in noise bandwidth of the loop filter 11. After an elapse of time, upon a pull-in of the noises in the carrier recovery block, the orbit of the energy band would no longer rotate and would become nearly in a form of a square. Thus, the reliability counter 101 would generate "logical 0". As a result, the carrier recovery enables lock detection and gear-shifts the pull-in noise bandwidth of the loop filter 11 to a locking noise bandwidth in order to reduce RMS jitter.

Thereafter, the loop filter 11 filters the loop bandwidth of the signal output by the phase/frequency error detector 8 based on the output signal of the lock detecting unit 10. Here, the loop filter 11 performs gear shifting by filtering the loop bandwidth of the signal output from the phase/frequency error detector 8 based on the signal lock_ detection output by the lock detecting unit 10. The numerical control oscillator 12 then generates a desired frequency based on the gear-shifted signal of the loop filter 11. Finally, the A/D converter 1 receives and converts a QAM signal to a corresponding digital signal based on the desired frequency of the numerical control oscillator 12. Subsequently, the process repeats again as described above.

However, a lock detecting apparatus of the multimedia digital broadcasting receiver in the related art as described above has some drawbacks. First, the lock detecting apparatus may be adaptable to a carrier detector but is inapplicable to a channel equalizer. Also, the apparatus uses only a single lock threshold value in the pull-in and the lock-in, which leads to a deterioration of the reliability.

SUMMARY OF THE INVENTION

Accordingly, an object of the present invention is to solve at least the problems and disadvantages of the related art.

An object of the present invention is to provide an effective lock detecting apparatus and method for a multimedia digital broadcasting receiver.

Another object of the present invention is to provide a more reliable lock detecting apparatus and method.

Another object of the present invention is to provide a lock detecting apparatus and method applicable to a channel equalizer as well as a carrier recovery unit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a lock detecting apparatus for a multimedia digital broadcasting receiver, which has a channel equalizer and a carrier recovery unit, includes a symbol determiner for generating a decision symbol D_I and D_Q based on a baseband digital signal R_I and R_Q output from the carrier recovery unit; and a lock detecting unit for determining lock control signals LD0, LD1 and LD2 based on the baseband digital signal R_I and R_Q output from the carrier recovery unit and based on the decision symbol D_I and D_Q output from the symbol determiner to generate a selected lock control signal for the channel equalizer and the carrier recovery unit.

The lock detecting unit according to the present invention includes a mean squared error (MSE) calculator for calculating a symbol-based MSE based upon the baseband digital signal R_I and R_Q of a derotator and based upon the decision symbol D_I and D_Q output from the symbol determiner; a threshold-calculator for comparing the symbol-based MSE of the MSE calculator with a pre-calculated MSE to determine whether a locking requirement is met, and generating a corresponding control signal; and a reliability count calculator for counting the control signal output from the threshold calculator for a predetermined time to generate a signal corresponding to the lock control signals LD0, LD1 and LD2.

In the present invention, the lock control signals LD0, LD1 and LD2 may be dependent on a blind mode or a decision-direct mode.

Also, the MSE calculator includes a first subtracter for subtracting the baseband digital signal R_I of the derotator from the decision symbol D_I of the symbol determiner; a first squarer for squaring the output signal of the first subtracter; a second subtracter for subtracting the baseband digital signal R_Q of the derotator from the decision symbol D_Q of the symbol determiner; a second squarer for squaring the output signal of the second subtracter; a mixer for mixing the output signals of the first and second squarers; and a sign expansion bit remover for removing a sign expansion bit from the mixed signal of the mixer.

The threshold calculator includes a MSE ROM table for storing the pre-calculated MSE for 4QAM, 16QAM, 64QAM and 256QAM; first and second comparators for comparing the pre-calculated MSE of the MSE calculator with the MSE stored in the MSE ROM table; and a multiplexer (MUX) for selecting one of either the output signals of the first and second comparators based on the control signal output from the reliability count calculator.

Finally, the reliability count calculator includes a reliability counter for counting the control signals output from the threshold calculator for a predetermined time to determine reliability.

Furthermore, the lock detecting unit sequentially performs a pull-in, a first lock-in, a second lock-in, and a locked-in. Moreover, shifting from the pull-in to the first lock-in step is dependent on the lock control signals LD0, LD1 and LD2; and shifting from the first lock-in to the second lock-in, and from the second lock-in to the locked-in are determined by an internal timer and the lock control signals LD0, LD1 and LD2.

Similar to the apparatus as described above, a lock detecting method for a multimedia digital broadcasting receiver according to the present invention comprises removing an ISI from a baseband digital signal at the channel equalizer based on a lock control signal to generate an ISI-removed baseband digital signal; removing a frequency offset from the ISI-removed baseband digital signal at the carrier recovery unit based on said lock control signal to generate baseband digital signals R_I and R_Q; generating a decision symbol D_I and D_Q based on the baseband digital signal R_I and R_Q; and generating the lock control signal based on the baseband digital signal R_I and R_Q and the decision symbol D_I and D_Q.

By using two threshold values, namely a threshold value for the blind mode and a second threshold value for the decision-direct mode to control both the channel equalizer and the carrier recovery unit, the reliability of the lock detecting unit is enhanced.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENT

Reference will now be made in detail to the preferred embodiments of the present invention, examples of which are illustrated in the accompanying drawings.

Figure 1:
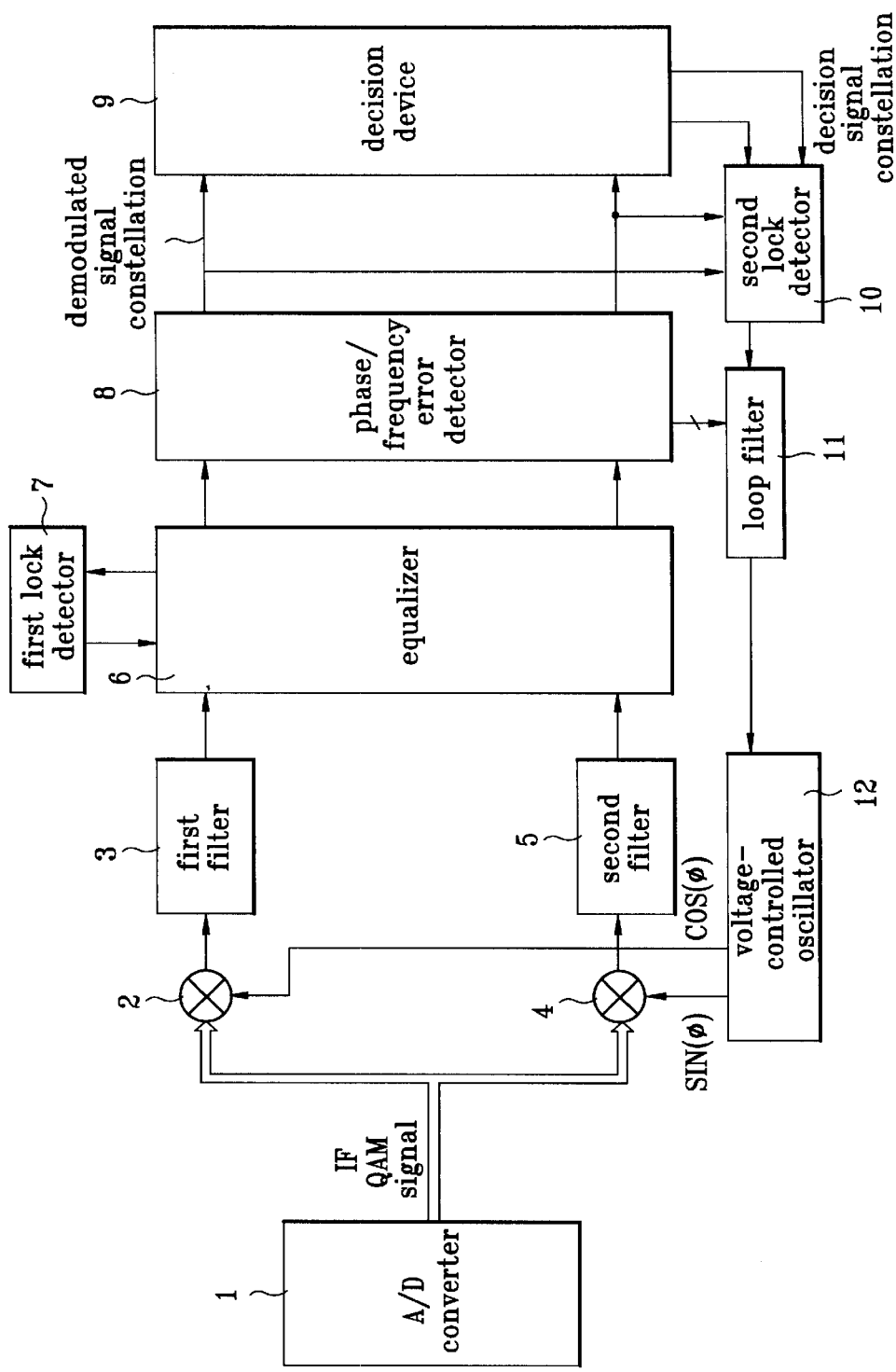
FIG. 1 is a diagram of a lock detecting apparatus for a multimedia digital broadcasting receiver in the related art.
Figure 2:
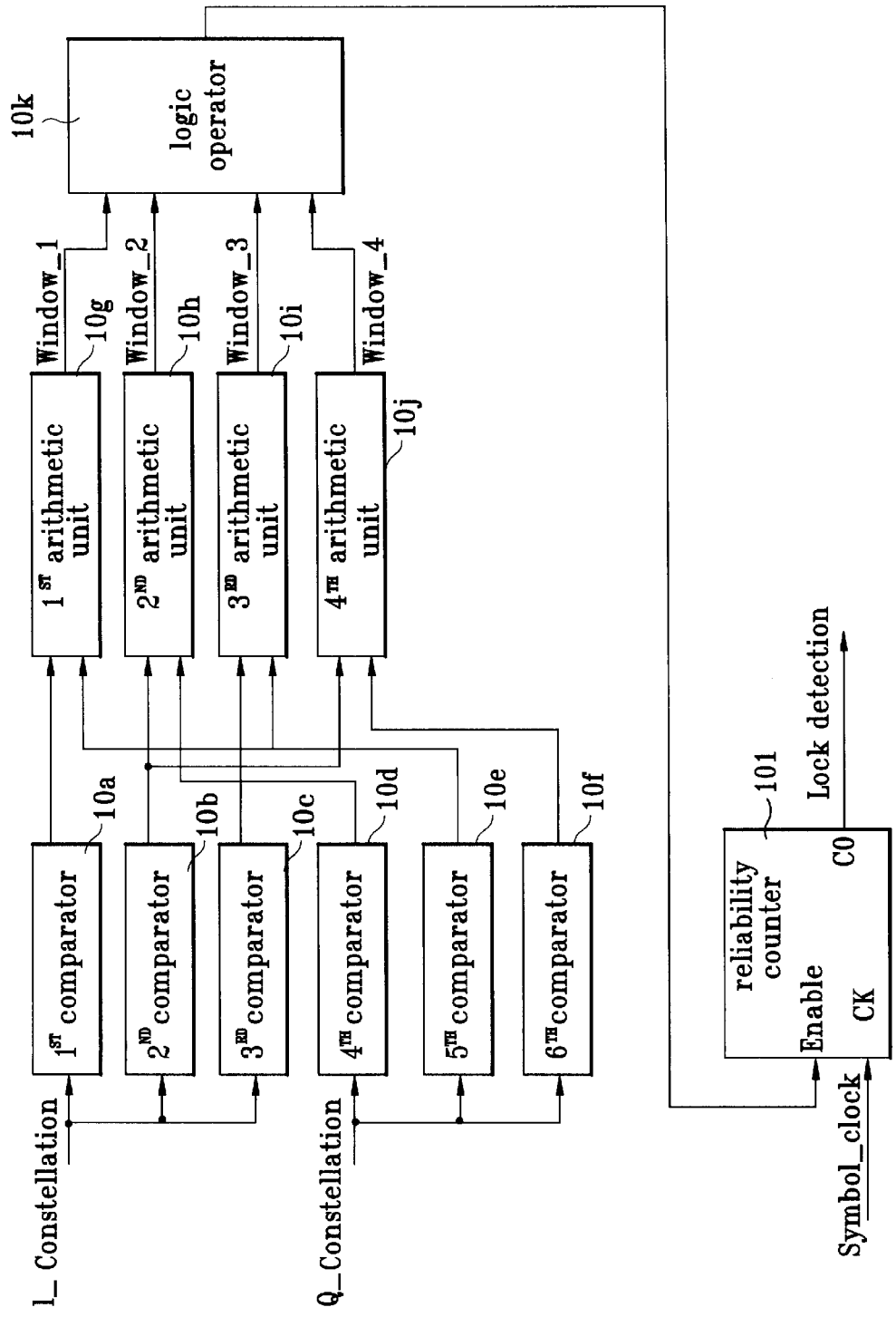
FIG. 2 is a diagram of a second lock detecting unit shown in FIG. 1.
Figure 3:
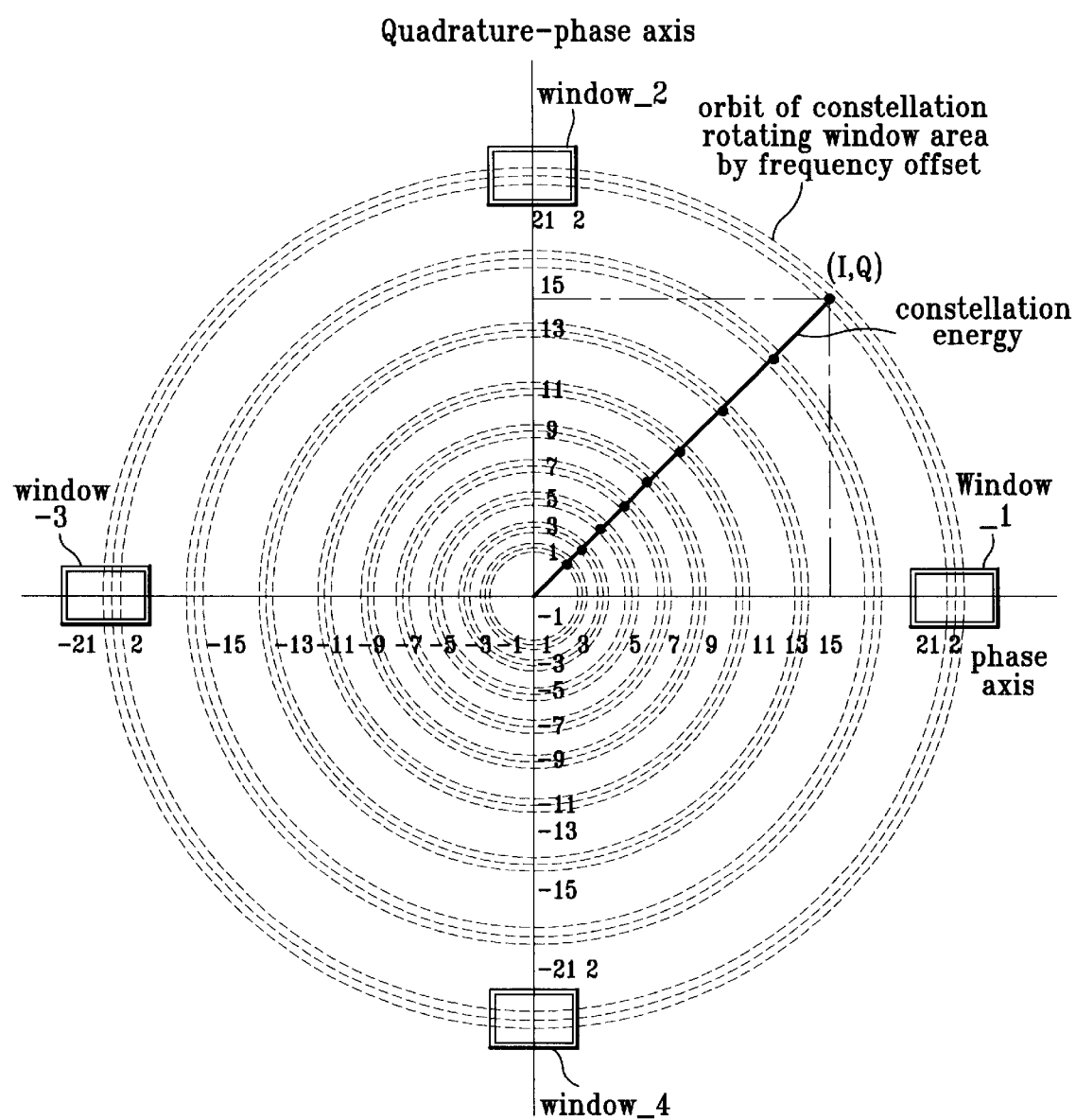
FIG. 3 is a diagram of a situation when a constellation is rotating with a frequency offset of 256-QAM.
Figure 4:
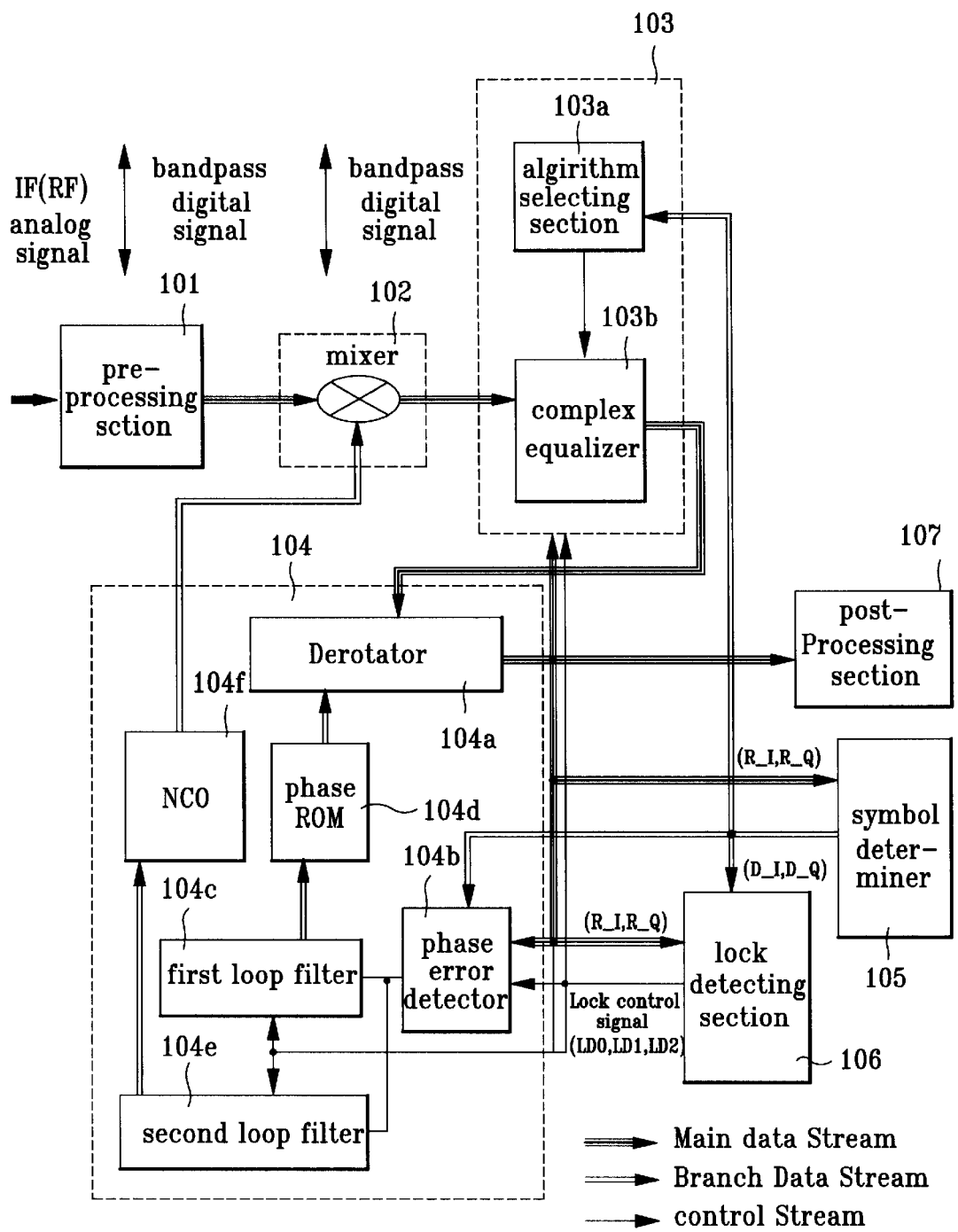
FIG. 4 is a diagram of a QAM receiver for a multimedia digital broadcasting receiver according to the present invention.

FIG. 4 is a diagram of a QAM receiver for a multimedia digital broadcasting receiver according to the present invention.

Referring to FIG. 4, the QAM receiver comprises a pre-processing unit 101 which receives and generates a band-pass digital signal from a IF analog signal; a mixer 102 which mixes the band-pass digital signal from the pre-processing unit 101 with a signal output under the control of a lock control signal to generate a baseband digital signal; a channel equalizer 103 which removes an inter-symbol interference (ISI) from the baseband digital signal based on the lock control signal to generate an ISI-removed baseband digital signal; and a carrier recovery unit 104 which removes a frequency offset from the baseband digital signal output from the channel equalizer 103 based on the lock control signal to generate baseband digital signals R_I and R_Q. Here, the control signal may be LD0, LD1 and LD2, depending upon the state of the system.

The QAM receiver also includes a symbol determiner 105 which generates decision symbols D_I and D_Q based on the baseband digital signals R_I and R_Q of the carrier recovery unit 104; a lock detecting unit 106 which determines the lock control signals LD0, LD1 and LD2 based on the baseband digital signal R_I and R_Q from the carrier recovery unit 104 and based on the decision symbol D_I or D_Q from the symbol determiner 105 to send the determined lock control signal to the channel equalizer 103 and the carrier recovery unit 104; and a post-processing unit 107 which performs a baseband digital processing based on the baseband digital signal R_I and R_Q output from the carrier recovery unit 104.

The channel equalizer 103 comprises an algorithm selecting unit 103a which selects an algorithm for a coefficient update based on the lock control signals LD0, LD1 and LD2; and a complex equalizer 103b which removes ISI from the baseband digital signal output from the mixer 102 to generate an ISI-removed baseband digital signal.

The carrier recovery unit 104 comprises a derotator 104a which compensates the phase of the output signal of the channel equalizer 103 to generate a baseband digital signal R_I and R_Q; a phase error detector 104b which detects phase errors from the baseband digital signal R_I and R_Q based on the lock control signals LD0, LD1 of LD2; a first loop filter 104c which gear shifts the phase based on the output signal of the phase error detector 104b; a phase ROM 104d which stores the gear-shifted phase from the first loop filter 104c; a second loop filter 104e which gear shifts the frequency based on the output signal of the phase error detector 104b; and a numerical control oscillator (NCO) 104f which generates a desired frequency based on the gear-shifted frequency from the second loop filter 104e. Although the present embodiment stores the gear-shifted phase in a ROM memory, other memories may be utilized.

Figure 5:
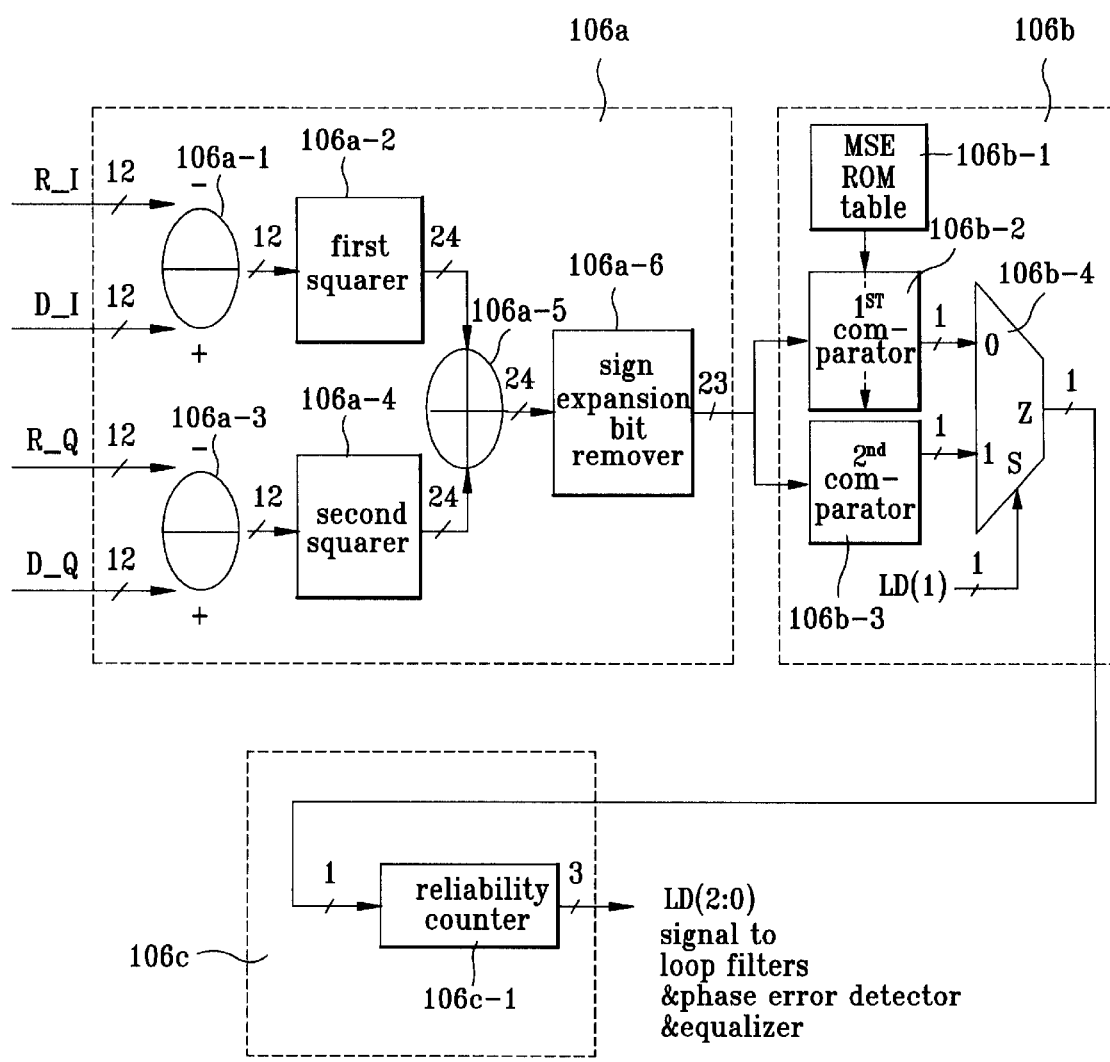
FIG. 5 is a diagram of a lock detecting unit shown in FIG. 4.

FIG. 5 is a detailed diagram of the lock detecting unit 106 in FIG. 4.

Referring to FIG. 5, the lock detecting unit comprises a MSE calculator 106a which calculates a symbol-based MSE from the baseband digital signal R_I and R_Q and the decision symbol D_I and D_Q; a threshold calculator 106b which compares the symbol-based MSE calculated at the MSE calculator 106a with a pre-calculated MSE to determine whether a locking requirement is met to generate a corresponding control signal; and a reliability count calculator 106c which counts the control signals from the threshold calculator 106b for a predetermine time to generate a signal corresponding to the lock control signals LD0, LD1 and LD2.

The MSE calculator 106a comprises a first subtracter 106a-1 which subtracts the baseband digital signal R_I from the decision symbol D_I; a first squarer 106a-2 which squares the output signal of the first subtracter 106a-1; a second subtracter 106a-3 which subtracts the baseband digital signal R_Q from the decision symbol D_Q; a second squarer 106a-4 which squares the output signal of the second subtracter 106a-3; a mixer 106a-5 which mixes the squared signals of the first and second squarers 106a-2 and 106a-4; and a sign expansion bit remover 106a-6 which removes a sign expansion bit from the output signal of the mixer 106a-5.

The threshold calculator 106b comprises a MSE ROM table 106b-1 which stores a pre-calculated MSEs for 4QAM, 16QAM, 64QAM and 256QAM; first and second comparators 106b-2 and 106b-3 which compare the MSE from the MSE calculator 106a with the pre-calculated MSE stored in the MSE ROM table 106b-1; and a multiplexer 106b-4 which selects a signal output by either the first or second comparators 106b-2 and 106b-3 based on the control signal from the reliability count calculator 106c.

Finally, the reliability count calculator 106c comprises a reliability counter 106c-1 which counts the control signal from the threshold calculator 106b for a predetermined time to determine the reliability.

Figure 6:
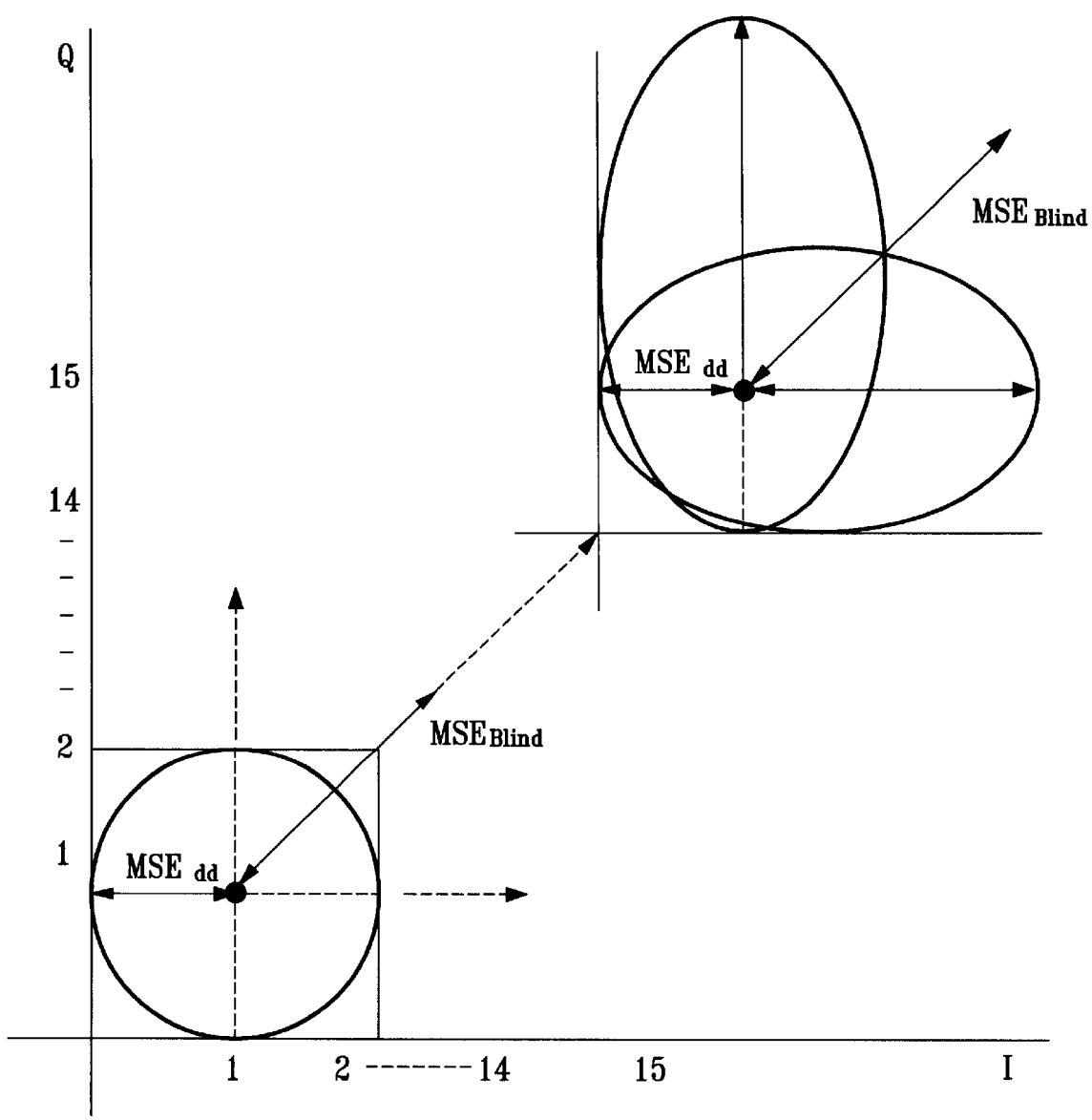
FIG. 6 is a diagram of an embodiment for calculating an MSE error ROM value.
Figure 7:
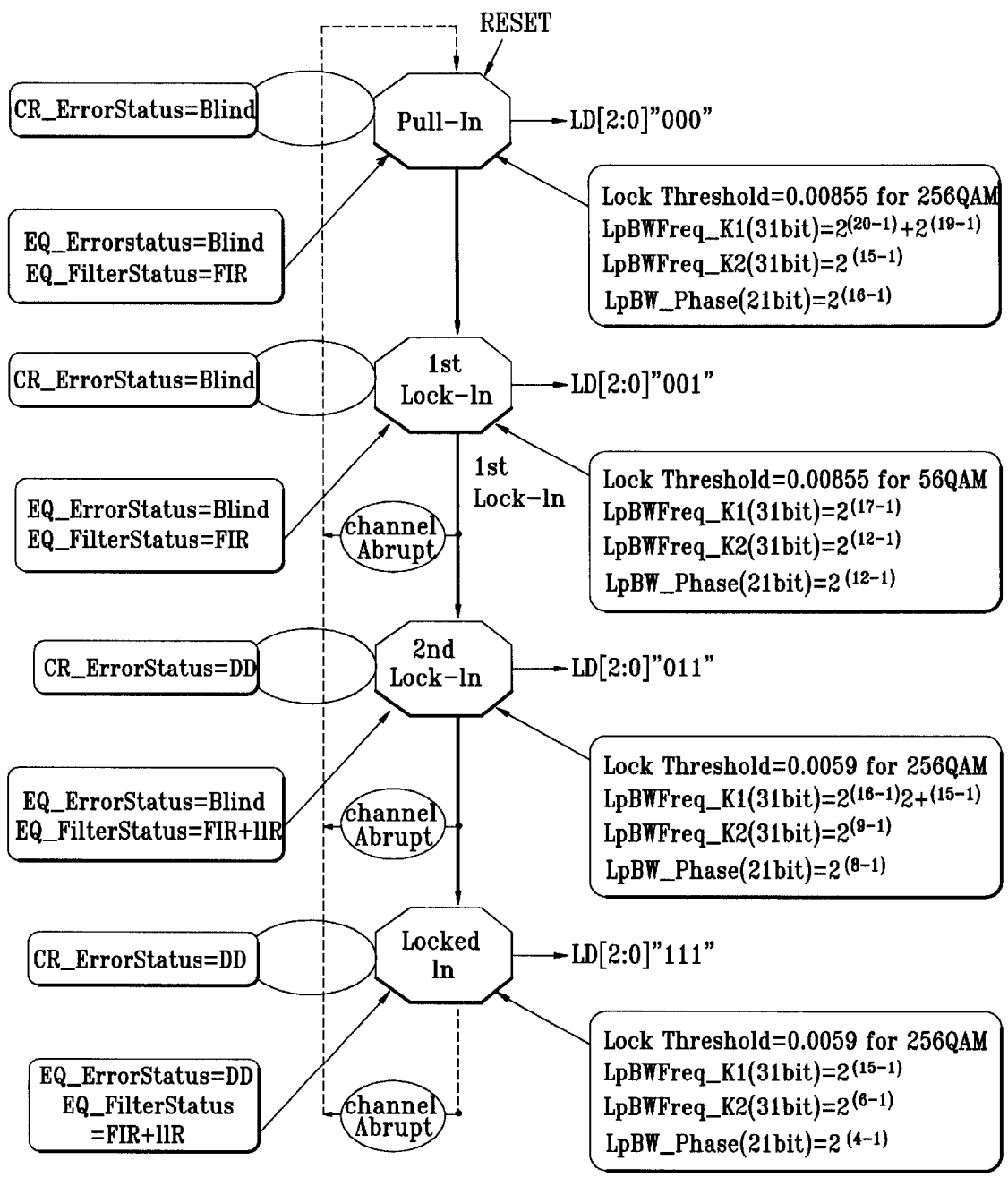
FIG. 7 is a flow chart for explaining an operation of the lock detecting unit shown in FIG. 4.
Figure 8:
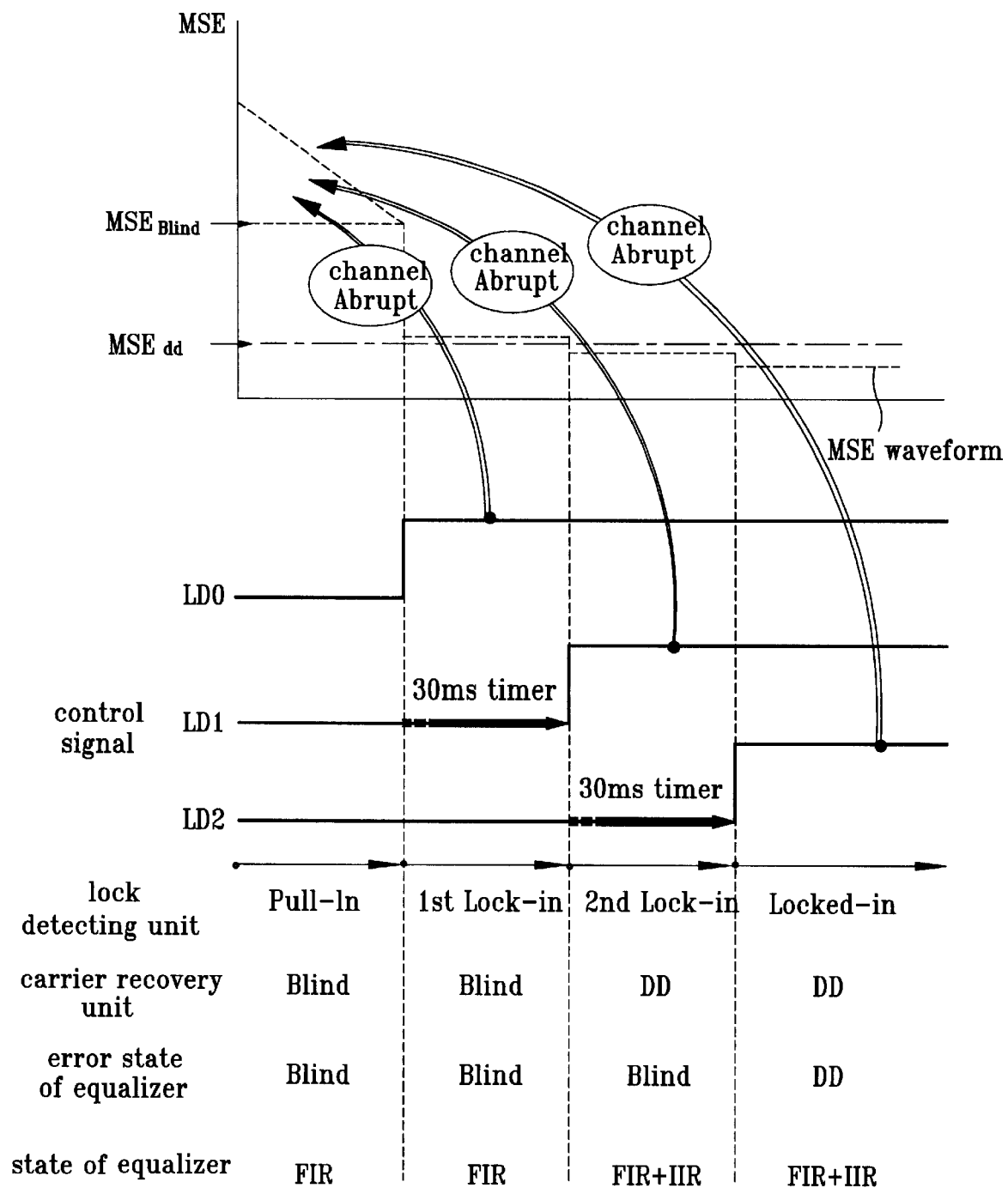
FIG. 8 shows a timing diagram of the lock detecting unit shown in FIG. 4, and an MSE waveform.

FIG. 6 is a diagram showing a calculation of the MSE ROM value, FIG. 7 is a flow chart for explaining the operation of the lock detecting unit 106 shown in FIG. 4, and FIG. 8 shows a timing diagram and an MSE waveform of the lock detecting unit 106. The operation of above-constructed lock detecting apparatus for the multimedia digital broadcasting receiver will be explained below.

Referring back to FIG. 4, the pre-processing unit 101 receives and generates a band-pass digital signal from a IF analog signal. The mixer 102 mixes the band-pass digital signal from the pre-processing unit 101 with a signal output by the carrier recovery unit 104 to generate a baseband digital signal. Here, the carrier recovery unit 104 outputs the signal based upon lock control signals LD0, LD1 and LD2. Based also upon the lock signal, the channel equalizer 103 removes ISI from the baseband digital signal to generate an ISI-removed baseband digital signal. Thus, the carrier recovery unit 104 removes a frequency offset from the ISI-removed baseband digital signal output from the channel equalizer 103 based on the lock control signals LD0, LD1 and LD2 to generate baseband digital signals R_I and R_Q. Namely, the derotator 106a in the carrier recovery unit 104 compensates the phase of the ISI-removed baseband digital signal output from the channel equalizer 103.

The symbol determiner 105 generates decision symbols D_I and D_Q based on the baseband digital signals R_I and R_Q. The lock detecting unit 106 then determines the lock control signals LD0, LD1 and LD2 based on the baseband digital signal R_I and R_Q and the decision symbol D_I or D_Q. Accordingly, the lock detecting unit 106 outputs the lock control signal to the channel equalizer 103 and the carrier recovery unit 104.

Particularly, as shown in FIG. 5, the MSE calculator 106a in the lock detecting unit 106 calculates a symbol-based MSE using the baseband digital signal R_I and R_Q and the decision symbol D_I and D_Q. The first subtracter 106a-1 subtracts the baseband digital signal R_I from the decision symbol D_I, and the first squarer 106a-2 squares the signal output by the first subtracter 106a-1. The second subtracter 106a-3 subtracts the baseband digital signal R_Q from the decision symbol D_Q, and the second squarer 106a-4 squares the signal output by the second subtracter 106a-3. The mixer 106a-5 mixes the squared signals from the first and second squarers 106a-2 and 106a-4. Finally, the sign expansion bit remover 106a-6 removes a sign expansion bit from the output signal of the mixer 106a-5 to output a symbol-based MSE.

Thereafter, the threshold calculator 106b compares the symbol-based MSE calculated at the MSE calculator 106a with a pre-calculated MSE to determine whether a locking requirement is satisfied, to thereby generate a control signal.

In the threshold calculator 106b, the first and second comparators 106b-2 and 106b-3, each compares the symbol-based MSE with a pre-calculated MSE stored in the MSE ROM table 106b-1. Namely the MSE ROM table 106b-1 stores a first threshold value for the blind mode and a second threshold value for the decision-direct mode. Accordingly, the first comparator 106b-2 compares the symbol-based MSE with the first threshold value and the second comparator 106b-3 compares the symbol-based MSE with a second threshold value.

The MSE ROM table 106b-1 contains the MSEs of the blind mode and the decision-direct mode for 4QAM, 16QAM, 64QAM and 256QAM, where the MSEs are calculated according to Equation 2 below.

Mean Squared Error $=(D\_I-R\_I)^2+(D\_Q-R\_Q)^2$ [Equation 2]

In Equation 2, R_I and R_Q are baseband digital signals output from the carrier recovery unit 104, and D_I and D_Q are decision symbols from the symbol determiner 105.

Table 1 contains example MSEs calculated according to Equation 2 for the embodiment shown in FIG. 6.

TABLE 1

| Modulation | Total Average Energy | Distance Index | $MSE_{blind}$ | $MSE_{dd}$ |
|---|---|---|---|---|
| 256-QAM | sqrt (170) | 1 3 5 7 9 13 15 | 0.00855 | 0.00588 |
| 64-QAM | sqrt (42) | 2 6 10 14 | 0.03 | 0.0235 |
| 16-QAM | sqrt (10) | 4 12 | 0.12 | 0.094 |
| 4-QAM | sqrt (2) | 8 | 0.479 | 0.376 |

After comparing the symbol-based MSE to the two threshold values, the multiplexer 106b-4 selects one of the output signal from either the first or second comparators 106b-2, 106b-3 to the reliability count calculator 106c.

The reliability count calculator 106c counts control signals output from the threshold calculator 106b for a predetermine time to generate and output lock control signals LD0, LD1 and LD2. Namely, the reliability counter 106c-1 generates a 3-bit control signal LD(2:0) indicating that the noise is in the pull-in state if the control signal from the threshold calculator 106b is "0" for a predetermined time; or indicating that the noise is under a lock-in state, if the control signal from the threshold calculator 106b is "1" for the predetermined time. Here, as shown in FIG. 7, the lock detecting unit 106 respectively outputs a control signal LD(2:0) of "000", "001", "011" and "111" as the system sequentially changes from a pull-in, a first lock-in, a second lock-in, and a locked-in state.

Therefore, rather than converting directly from a pull-in state to a lock-in state, the pull-in proceeds to a first lock-in state according to the lock control signal, while the first lock-in shifts to a second lock-in and the second lock-in shifts to a locked-in state according to an internal timer of for example 30 ms as well as the lock control signal. Although the present embodiment includes two intermediate lock-in states, i.e. the first and second lock-in, more or less than two intermediate lock-in states may be implemented by appropriately setting the internal timer.

In the present invention, as shown in FIG. 8, the MSE waveform varies based on the timing of the 3-bit control signal LD(2:0) from the reliability counter 106c-1 of the reliability count calculator 106c.

Referring to FIGS. 7 and 8, for example, when the lock detecting unit is in the pull-in state, LD0=LD1=LD2=0 to output a 3 bit the control signal LD(2:0) of "000" and a lock threshold of 0.00855 for a blind mode is utilized in the threshold calculator 106b. In the first lock-in state, LD0=1 and LD1=LD2=0 to output a 3 bit the control signal LD(2:0) of "001" and the lock threshold of 0.00855 for a blind mode is still utilized in the threshold calcularor 106b. In the second lock-in state, LD0=LD1=1 and LD2=0 to output a 3 bit the control signal LD(2:0) of "011" and the lock threshold of 0.00855 for a blind mode is shifted to a lock threshold of 0.0059 for a decision-direct mode in the threshold calcularor 106b. Finally, in the locked-in state, LD0=LD1=LD2=1 to output a 3 bit the control signal LD(2:0) of "111" and the lock threshold of 0.0059 for a decision-direct mode is utilized in the threshold calcularor 106b.

Therefore, the symbol-based MSE from the MSE calculator 106a is initially compared with the threshold value of the blind mode and when the symbol-based MSE falls below the threshold value of the blind mode, the lock detecting unit enters the first lock-in state. Subsequently, if the symbol-based MSE remains below the threshold value of the blind mode for a predetermined time period, the lock detecting unit enters the second lock-in state after which the threshold value of the decision-direct mode is utilized. Namely, the symbol-based MSE is compared with the threshold value of the decision-direct mode and if the symbol-based MSE remains lower than the threshold value of the decision-direct mode for the predetermined time period, the lock detecting unit enters the lock-in state.

In the above embodiment, a timer of 30 ms is used as the predetermined time period for switching from the first to second lock-in and from the second to the locked-in state. However, the present invention may be implemented such that the lock detecting unit enters the second lock-in state once the symbol-based MSE falls below the threshold value of the decision-direct mode. Thereafter, the lock detecting unit would enter the locked-in state if the symbol-based MSE remains lower than the threshold value of the decision-direct mode for a predetermined time period. In any case, if a channel distortion abruptly occurs at any state, the lock detecting unit 106 automatically enters the pull-in state and the internal timers are reset.

Thus, the channel equalizer 103 removes ISI from the baseband digital signal based on the lock control signals LD0, LD1 and LD2 to generate an ISI-removed baseband digital signal.

That is, the algorithm selecting unit 103a selects an algorithm for a coefficient update based on the lock control signals LD0, LD1 and LD2. The selected algorithm is a constant modulus algorithm (CMA) when the lock control signals LD0, LD1 and LD2 are in the blind mode and is a least mean squared (LMS) algorithm while in the decision-direct mode. As shown in FIG. 8, the lock control signals LD0, LD1 and LD2 correspond to a blind mode when the lock detecting unit 106 is in the pull-in state, the first lock-in state or the second lock-in state. On the other hand, the lock control signals LD0, LD1 and LD2 correspond to a decision-direct mode when the lock detecting unit 106 is in the locked-in state. The channel equalizer 103 corresponds to FIR in the pull-in and the first lock-in state, and corresponds to FIR and IIR in the second lock-in and the locked-in state.

Subsequently, the complex equalizer 103b removes ISI from the baseband digital signal output from the mixer 102 to generate an ISI-removed baseband digital signal according to the selected algorithm from the algorithm selecting unit 103a.

Thus, the carrier recovery unit 104 removes a frequency offset from the ISI-removed baseband digital signal from the channel equalizer 103 based on the lock control signals LD0, LD1 and LD2 to generate baseband digital signals R_I and R_Q. That is, the phase error detector 104b in the carrier recovery unit 104 detects phase errors from the baseband digital signal R_I and R_Q of the derotator 104a based on the lock control signals LD0, LD1 and LD2. Here, the lock control signals LD0, LD1 and LD2 correspond to the blind mode when the lock detecting unit 106 is in the pull-in or the first lock-in state, and correspond to the decision-direct mode while in the second lock-in or the locked-in state.

The first loop filter 104c gear shifts the phase of the ISI-removed baseband digital signal based on the output signal of the phase error detector 104b. Here, the first loop filter 104c is a loop filter used for phase removal. The phase ROM 104d then stores the gear-shifted phase from the first loop filter 104c. The derotator 104a then recovers the phase of the signal output from the channel equalizer 104 using the phase data stored in the phase ROM 106d. Thus, the symbol determiner 105 slices a carrier wave recovered by the derotator 104a into a predetermined band to generate signal constellations.

Also, the second loop filter 104e gear shifts the frequency of the ISI-removed baseband digital signal based on the output signal of the phase error detector 104b. The numerical control oscillator 104f generates a desired frequency based on the gear-shifted frequency from the second loop filter 104e. The mixer 102 mixes the band-pass digital signal from the pre-processing unit 101 based on the frequency from the numerical control oscillator 104f with the signal from the carrier recovery unit 104 based on the lock control signals LD0, LD1 and LD2 to generate a baseband digital signal.

The post-processing unit 107 performs a baseband digital processing based on the baseband digital signal R_I and R_Q output from the carrier recovery unit 104.

As described above, the lock detecting apparatus for the multimedia digital broadcasting receiver according to the present invention has the following advantages. First, the lock detecting apparatus is applicable to a channel equalizer as well as a carrier recovery unit, and easy to expand 4QAM, 16QAM, 64QAM or 256QAM without a separate circuitry because a general purpose lock detector can be implemented with a minimum hardware. Also, two lock threshold values are used throughout the pull-in and the lock-in states, thereby improving the reliability of the lock detector.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A lock detecting system for a multimedia digital broadcasting receiver comprising:

a channel equalizer which removes an ISI from a baseband digital signal based on a lock control signal to generate an ISI-removed baseband digital signal;

a carrier recovery unit which removes a frequency offset from the ISI-removed baseband digital signal based on said lock control signal to generate baseband digital signals R_I and R_Q;

a symbol determiner which generates a decision symbol D_I and D_Q based on the baseband digital signal R_I and R_Q; and a lock detecting unit which generates the lock control signal based on the basebase digital signal R_I and R_Q and the decision symbol D_I and D_Q.

2. A system of claim 1, wherein the lock detecting unit comprises:

a MSE calculator which calculates a symbol-based MSE from the baseband digital signal R_I and R_Q and the decision symbol D_I and D_Q;

a threshold calculator which compares the symbol-based MSE calculated by the MSE calculator with a pre-calculated MSE to generate a state signal; and a reliability count calculator which counts the state signal from the threshold calculator for a predetermined time to generate the lock control signal.

3. A system of claim 2, wherein the MSE calculator comprises:

a first subtracter which subtracts the baseband digital signal R_I from the decision symbol D_I;

a first squarer which squares the output signal of the first subtracter;

a second subtracter which subtracts the baseband digital signal R_Q from the decision symbol D_Q;

a second squarer which squares the output signal of the second subtracter;

a mixer which mixes the squared signals of the first and second squarers; and a sign expansion bit remover which removes a sign expansion bit from the output signal of the mixer to generate the symbol-based MSE.

4. A system of claim 2, wherein the threshold calculator comprises:

a memory which stores pre-calculated MSEs for at least one type of QAM;

a first comparator which compare the symbol-based MSE with a first pre-calculated MSE stored in said memory;

a second comparator which compare the symbol-based MSE with a second pre-calculated MSE stored in said memory;

a multiplexer which selects a signal output by either the first or second comparator as the state signal output to the reliability count calculator.

5. A system of claim 4, wherein the memory stores pre-calculated MSEs of a blind mode and a decision-direct mode for 4QAM, 16QAM, 64QAM and 256QAM.

6. A system of claim 4, wherein the memory is a ROM.

7. A system of claim 4, wherein the first pre-calculated MSE is a threshold value corresponding to a blind mode and the second pre-calculated MSE is a threshold value corresponding to a decision-direct mode.

8. A system of claim 2, wherein the reliability count calculator comprises a reliability counter which counts the state signal from the threshold calculator for a predetermined time to determine the reliability.

9. A system of claim 1, wherein the lock control signal is a 3 bit control signal of a first lock control signal LD0, a second lock control signal LD1, and a third lock control signal LD2.

10. A system of claim 9, wherein the first lock control signal LD0, the second lock control signal LD1 and the third lock control signal LD2 determines the mode of the channel equalizer and the carrier recovery unit, said mode being one of either a blind mode or a decision-direct mode.

11. A system of claim 9, wherein the lock detecting unit shifts from a pull-in state to a first lock-in state based upon the lock control signals LD0, LD1 and LD2; and shifts from the first lock-in state to a second lock-in state and from the second lock-in state to a locked-in state based upon an internal timer of the reliability count calculator and the lock control signals LD0, LD1 and LD2.

12. A system of claim 1, wherein the channel equalizer comprises:

an algorithm selecting unit which selects an algorithm for a coefficient update based on the lock control signal; and a complex equalizer which removes ISI from the baseband digital signal to generate an ISI-removed baseband digital signal.

13. A system of claim 12, wherein a constant modulus algorithm is selected if the lock control signal indicates that the channel equalizer is in the blind mode and a least mean squared algorithm is selected if the lock control signal indicates that the channel equalizer is in the decision-direct mode.

14. A system of claim 1, wherein the carrier recovery unit comprises:

a derotator, which compensates a phase of the ISI-removed baseband digital signal to generate the baseband digital signal R_I and R_Q;

a phase error detector which detects phase errors from the baseband digital signal R_I and R_Q based on the lock control signal;

a first loop filter which gear shifts the phase of the ISI-removed baseband digital signal based on an error detected by the phase error detector;

a memory which stores the gear-shifted phase from the first loop filter;

a second loop filter which gear shifts the frequency of the ISI-removed baseband digital signal based on an error detected by the phase error detector; and a numerical control oscillator which generates a desired frequency based on the gear-shifted frequency from the second loop filter to remove the frequency offset from the ISI-removed baseband digital signal.

15. A lock detecting method for a multimedia digital broadcasting receiver comprising:

(a1) removing an ISI from a baseband digital signal at the channel equalizer based on a lock control signal to generate an ISI-removed baseband digital signal;

(b1) removing a frequency offset from the ISI-removed baseband digital signal at the carrier recovery unit based on said lock control signal to generate baseband digital signals R_I and R_Q;

(c1) generating a decision symbol D_I and D_Q based on the baseband digital signal R_I and R_Q; and (d1) generating the lock control signal based on the baseband digital signal R_I and R_Q and the decision symbol D_I and D_Q.

16. A method of claim 15, wherein (d) comprises:

(a2) calculating a symbol-based MSE from the baseband digital signal R_I and R_Q and the decision symbol D_I and D_Q;

(b2) comparing the symbol-based MSE with a pre-calculated MSE to generate a state signal; and (c2) counting the state signal for a predetermined time to generate the lock control signal.

17. A method of claim 16, wherein (a2) comprises:

(a3) subtracting the baseband digital signal R_I from the decision symbol D_I and squaring the result;

(b3) subtracting the baseband digital signal R_Q from the decision symbol D_Q and squaring the result;

(c3) mixing the squared signals of (a3) and (b3); and (d3) removing a sign expansion bit from the signal output signal in (c3) to generate the symbol-based MSE.

18. A method of claim 16, wherein (b2) comprises:

(a3) storing pre-calculated MSEs for at least one type of QAM;

(b3) comparing the symbol-based MSE with a first pre-calculated MSE;

(c3) comparing the symbol-based MSE with a second pre-calculated MSE;

(d3) selecting a signal output by either (b3) or (c3) as the state signal.

19. A method of claim 15, wherein the lock control signal is a 3 bit control signal of a first lock control signal LD0, a second lock control signal LD1, and a third lock control signal LD2.

20. A method of claim 19, wherein determining the mode of the channel equalizer and the carrier recover unit based on the first lock control signal LD0, the second lock control signal LD1 and the third lock control signal LD2, said mode being one of either a blind mode or a decision-direct mode.

* * * * *